United States Patent [19]

Morgan

[11] Patent Number: 5,061,566

[45] Date of Patent: Oct. 29, 1991

[54] CORROSION INHIBITING EMI/RFI SHIELDING COATING AND METHOD OF ITS USE

[75] Inventor: Noredin H. Morgan, Billerica, Mass.

[73] Assignee: Chomerics, Inc., Woburn, Mass.

[21] Appl. No.: 457,983

[22] Filed: Dec. 28, 1989

[51] Int. Cl.$^5$ ............................................. B32B 27/40
[52] U.S. Cl. ............................. 428/423.1; 428/424.6; 428/425.8; 428/425.9; 524/93; 524/94; 524/435; 524/715; 524/720
[58] Field of Search .................... 524/94, 435, 720, 93, 524/715; 428/423.1, 425.8, 424.6, 425.9

[56] References Cited

U.S. PATENT DOCUMENTS

| | | | |
|---|---|---|---|
| 3,293,203 | 12/1966 | Paulus et al. | 260/37 |
| 3,344,064 | 9/1967 | Brady et al. | 252/12 |
| 3,422,165 | 1/1969 | Brotherton et al. | 260/859 |
| 3,948,811 | 4/1976 | Clary et al. | 252/512 |
| 4,305,847 | 12/1981 | Stoetzer et al. | 252/512 |
| 4,610,808 | 9/1986 | Kleiner | 252/512 |
| 4,629,756 | 12/1986 | Kerbow | 524/440 |
| 4,657,785 | 4/1987 | Kelly et al. | 427/255.6 |
| 4,705,647 | 11/1987 | Yamaguchi et al. | 252/512 |
| 4,781,980 | 11/1988 | Yoshitake et al. | 428/403 |
| 4,863,986 | 9/1989 | Re et al. | 524/197 |
| 4,873,139 | 10/1989 | Kinosky | 428/341 |
| 4,921,623 | 5/1990 | Yamaguchi et al. | 252/512 |
| 4,931,479 | 6/1990 | Morgen | 521/76 |
| 4,950,423 | 8/1990 | Sullivan | 524/401 |

FOREIGN PATENT DOCUMENTS 61-87766  5/1986  Japan .

OTHER PUBLICATIONS

"Technical Bulletin 3401" PMC Specialties Group.
"Technical Data Bulletin: Polyamine® 1000" Polaroid.
"Structure–Activity Relationships of Triazole Copper–Corrosion Inhibitors: Rational Development of Enhanced Activity Inhibitors", Orin Hollander, Paper Number 455, Corrosion '89 Apr. 17–21, 1989.
"Benzotriazole and Related Compounds as Corrosion Inhibitors for Copper", J. B. Cotton and I. R. Scholes, British Corrosion Journal, 1967, vol. 2, Jan..
"Aromatic Triazoles Inhibit Corrosion of Copper and Copper Alloys", C. J. Korpics, Materials Performance, vol. 13, No. 2, pp. 36–38, Feb., 1974.

Primary Examiner—Merrell C. Cashion, Jr.
Assistant Examiner—D. S. Nakarani
Attorney, Agent, or Firm—John Dana Hubbard; Celia H. Ketley; William L. Baker

[57] ABSTRACT

A corrosion inhibiting, EMI/RFI shielding composition is provided comprising a polyurethane resin which comprises a hydroxy or amine functional first polymer and an isocyanate terminated second polymer, a stabilized conductive filler, and an azole. In one embodiment of the invention a coating is provided comprising a polyurethane which comprises a fluoroolefin vinyl ether and an isocyanate terminated castor oil prepolymer, a stabilized copper powder, and a triazole selected from the group consisting of alkyl substituted aromatic trianzoles and other azoles. The invention further provides a method of coating a substrate with a coating of the invention in order to provide EMI/RFI shielding and prevent corrosion, and a substrate thus coated.

35 Claims, No Drawings

CORROSION INHIBITING EMI/RFI SHIELDING COATING AND METHOD OF ITS USE

BACKGROUND OF THE INVENTION

The present invention relates to a corrosion inhibiting conductive coating which provides EMI/RFI shielding and prevents corrosion when applied to conductive substrates.

When dissimilar metal and/or conductive composite substrates are joined together in the presence of an electrolyte, a galvanic potential is established at the interface between the substrates. If this assembly is exposed to the environment, particularly under severe conditions such as salt fog or salt fog containing a high concentration of $SO_2$, corrosion of the least noble of the substrates will occur, causing failure of the assembly. Mechanisms other than the establishment of galvanic potentials, e.g. crevice corrosion, may also cause corrosion and eventual failure of the part. In these cases one or all of the exposed materials in the assembly may corrode.

Thus, it has long been an object, especially among manufacturers of aircraft mainframes, ships, telecommunication equipment and other such equipment which is to be exposed to the environment, to prevent corrosion at there interfaces.

Further, it is often necessary to provide EMI/RFI shielding to the equipment described above, as aircraft, ships, etc, frequently utilize electronic systems which either radiate or are susceptible to electromagnetic or radio frequency interference (EMI/RFI).

Various methods have been attempted to achieve one or both of these objectives. Conventional shielding gaskets have been used in these applications to provide EMI/RFI shielding. These gaskets generally provide satisfactory shielding, but do not address the problem of corrosion. In fact, when the metal filler or mesh in the shielding gasket is different from either of the substrates a galvanic potential is established across all three elements, often causing the gasket itself, and eventually the entire assembly, to corrode.

Coatings comprising polymers and nickel filler have been applied to the substrates in an attempt to improve shielding and reduce corrosion. This approach is capable of providing acceptable shielding effectiveness of the assembly, but under conditions in which the coating remains conductive it has little or no effect on corrosion protection.

Some success in preventing corrosion has been obtained by sealing the interface with polythioether or polysulfide sealants containing chromate corrosion inhibitors. However, it is difficult to handle and to dilute these systems enough to use them as sprayable coatings, which are generally preferred for their ease of application. Further, they do not exhibit good thermal stability and become brittle over time.

Thus it is desired to provide a coating which will resist the corrosion of conductive substrates, even in severe environments, while maintaining good EMI/RFI shielding. It is further desired to provide such a coating without the use of hazardous chromates.

SUMMARY OF THE INVENTION

The present invention is directed to a corrosion inhibiting EMI/RFI shielding coating composition. More particularly, the invention is directed to a corrosion inhibiting conductive coating comprising a polyurethane resin which comprises a first polymer selected from the group consisting of isocyanates and isocyanate terminated prepolymers, and a second polymer selected from the group consisting of polymers having an amine functionality, polymers having a hydroxyl functionality, polymers having both amine and hydroxyl functionalities, and mixtures thereof; a stabilized conductive filler; and an azole.

In one embodiment of the invention the corrosion inhibiting coating comprises a polyurethane resin comprising a first polymer selected from the group consisting of isocyanates and isocyanate terminated castor oil prepolymers, and a second polymer selected from the group consisting of polyether polyols, polythiols and polyamines; a stabilized copper powder; and a triazole selected from the group consisting of alkyl substituted aromatic triazoles and other triazoles.

In a preferred embodiment the coating comprises from about 10 to 50 weight percent polyurethane, from about 30 to 80 weight percent stabilized conductive filler, and from about 0.1 to 3 weight percent aromatic triazole, based on the total solids in the coating composition. It is also preferred that the weight ratio of the first to second polymer be from about 1:2 to 1:6, that the second polymer be fluorinated, and that the stabilized conductive filler be a stabilized copper powder.

In its method aspects, the present invention is directed to a method of coating conductive substrates to prevent corrosion when these substrates are exposed to harsh environments, e.g. in naval and aerospace applications, while maintaining good EMI/RFI shielding. This method comprises the steps of a) providing a corrosion inhibiting conductive coating comprising a polyurethane resin which comprises a first polymer selected from the group consisting of isocyanates and isocyanate terminated prepolymers, and a second polymer selected from the group consisting of polymers having an amine functionality and polymers having a hydroxyl functionality; a stabilized conductive filler; and an aromatic triazole; and b) applying the corrosion inhibiting coating to a conductive substrate. The method may further comprise the additional step of curing the coating. The coating may be cured for at least 15 minutes, and preferably 30 minutes at 250° F., or at least 5 days, and preferably 7 days at ambient temperature.

The present invention further provides a substrate coated with a coating according to the invention. The coated substrate may be bonded to a second substrate or a gasket to form an assembled part and exposed to severe environments such as salt fog with minimal corrosion of the part.

DETAILED DESCRIPTION OF THE INVENTION

The present invention relates to a corrosion inhibiting coating comprising a polyurethane resin, a stabilized conductive filler, and an aromatic triazole. It has been found that this combination unexpectedly provides excellent corrosion resistance to a variety of conductive substrates, even under severe conditions such as long term exposure to salt fog, salt fog containing a high concentration of $SO_2$, etc.

The coating of the invention is generally provided as a two component system, with the hydroxy or amine functional second polymer (part A), and the isocyanate terminated first polymer (part B) being stored separately until the time of use. Generally, the stabilized conductive filler, aromatic triazole, and any other optional ingredients are incorporated in part A. Part A and part B, when stored separately, are generally shelf stable for at least 6 months at ambient temperature. When the two components are mixed, the mixture will begin to increase in viscosity as it crosslinks until it eventually gels. The time during which the mixture is of a workable viscosity, i.e. the pot life of the coating, will vary depending upon the hydroxyl number of the second polymer, the batch size, the solids level of the composition, and any optional accelerators, diluents or inhibitors present in the coating composition. The pot life will generally be from about 15 minutes to about 1 hour. After the coating is applied to a substrate, chain extension and/or cross-linking will continue, but at a slower rate since the coating is now present in a thin film and the exothermic cure reaction is unable to generate as much heat as when the mixture was present in a large mass. Thus the cure time of an unaccelerated coating composition in a thin film will generally be at least 5 days, and usually 7 days at ambient temperature. If a faster cure is desired the coating may be heat cured. In this case, it is preferred that the coating be cured for at least 15 minutes, and preferably 30 minutes at about 250° F. It is particularly preferred that the coating be allowed to dry for approximately 30 minutes at ambient temperature before heat curing. The rate of cure may also be accelerated by the addition of optional accelerators such as metallic catalysts, e.g. dibutyltin dilaurate, although the addition of an accelerator will also tend to shorten the pot life of the mixture.

Many combinations of hydroxy or amine functional and isocyanate-functional polymers may be successfully used in the present invention to form the reacted polyurethane. It is generally preferred that the polyurethane be hydrophobic; it is particularly preferred that the hydroxy or amine functional second polymer be fluorinated. It is also preferred that the second polymer be selected from the group consisting of polyether polyols and polyether amines. The preferred molecular weight and hydroxyl number of the second polymer will vary based on the requirements of the given application; the higher the hydroxyl number, the better the adhesion and chemical resistance of the coating, but the shorter its pot life. Additionally, the higher the molecular weight of the second polymer, the better the chemical resistance of the coating. For most applications, a molecular weight of from 2000 to 150,000 and hydroxyl number of from 25 to 100 are preferred. It is also generally preferred that the hydroxyl or amine functionality be greater than 1. Particularly preferred polymers are fluoroolefin vinyl ethers, such as those commercially available from I.C.I. Americas, Inc. under the tradename LUMIFLON ®. These polymers generally have a molecular weight of from about 4000 to 150,000 and a fluorine content of from 25% to 30%. A particularly preferred polyether amine is polytetramethyleneoxide-di-p-aminobenzoate, commercially available from Polaroid Corp. under the tradename POLYAMINE ® 1000. Polythiols which may be used in the invention include polyether/thioether polyols.

Most isocyanate resins and isocyanate terminated prepolymers may be used in the invention. Methylene diisocyanate and reaction products thereof with castor oil are generally preferred. Particularly preferred is a methylene diisocyanate terminated castor oil prepolymer which is commercially available from Aceto Chemical under the tradename URIC 2023. This polymer is preferred because the castor oil is a high purity grade and provides an excellent coating.

The term "stabilized conductive filler" as used herein refers to any electrically conductive filler which has been treated such that the surfaces of the filler particles are protected from oxidation and the filler remains electrically conductive after such treatment. These stabilized fillers, when used in the coating compositions of the invention, have been found to greatly increase the resistance of the coated substrates to corrosion, especially during long term exposure to salt fog or heat, while maintaining sufficient electrical conductivity to provide EMI/RFI shielding. Such stabilized fillers may be obtained by purchasing them in prestablized form from a manufacturer of stabilized fillers, or by purchasing unstablilized conductive fillers and treating them to prevent surface oxidation of the particles. A preferred prestabilized filler for use in the invention is a stabilized copper powder, which is commercially available in prestablized form from Fujikura Kasei of Japan under the tradename Fujikura ® CP-10. This prestabilized filler is a silver plated copper powder produced by a substitution plating process. This process is described in detail in Japanese Patent No. 53/134759, and comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid. The ratio of silver to copper in the final product is generally from 5:95 to 50:50, and preferably from 10:90 to 30:70. Other prestabilized fillers may also be used in the invention. If it is desired by the user to stabilize the filler this may be accomplished by coating the surface of the filler particles with a material which will inhibit oxidation of the particle, generally a noble metal such as gold or silver or a fatty acid. The filler may be coated by mixing or milling the filler with a silver salt and/or a fatty acid, preferably for a period of time adequate to coat substantially all of the filler particles. A method of treating fillers with fatty acids is disclosed in U.S. Pat. No. 4,781,980, the disclosure of which is incorporated herein by reference. Fillers which may be stabilized include, but are not limited to copper, nickel, silver plated metals, nickel-graphite fibers and combinations thereof.

Aromatic triazoles are known in the art as organic corrosion inhibitors, and are believed to directly bond to metal surfaces to produce inhibiting complexes. However, when used in conventional conductive coating systems they do not provide adequate corrosion protection in long term salt fog exposure. However, for reasons unknown to the inventor, in the coating of the invention, in combination with a polyurethane and a stabilized metal filler, the aromatic triazole provides excellent corrosion resistance during prolonged salt fog exposures of greater than 1000 hours on Al 3000 series alloys. In the coating of the invention, any azole may be used, preferably an aromatic triazole, an imidazole, or a thiazole, and most preferbly an alkyl substituted aromatic triazole, e.g. tolytriazole and benzotriazole. These chemicals are readily available commercially. A particularly preferred triazole is a proprietary material available from PMC Specialties Group under the tradename COBRATEC ® 205. Generally triazoles are acidic, and thus at higher levels the triazole may alter the cure characteristics of the composition, slightly reducing the chemical resistance of the cured coating. For optimal cure characteristics, in applications where high chemical resistance is required, a neutral or alkaline azole, such as 2,5-(aminopentyl)-benzimidazole (commercially available from Mobay Chemical, under the tradename Preventol Trial Products C.T-3) may be used instead of the triazole component of the coating composition.

Additionally, the coating of the invention may further optionally comprise a chromate salt. This additional additive is preferred in applications where the coating is to be applied to a metal and exposed to mechanical abuse which may cause scratching of the coating. It has been found that the addition of chromates to the coating enables the cured coating to "self-heal" when it is scratched, thereby improving the integrity of the coating and the protection of the underlying metal surface. This property is generally not required when the coating is to be used on a non-metal (e.g. composite) substrate. A preferred chromate salt is zinc chromate, and it is generally preferred that the chromate be present in the composition at a level of from about 0.01 to about 15 weight percent based on the total solids in the coating composition. It is generally convenient to add the chromate to the composition by first milling it with a portion of the second polymer and then adding it to part A of the composition.

Optionally, the coating composition may further comprise such conventional additives as surfactants, accelerators, inhibitors, diluents and active solvents, in amounts which do not deleteriously effect the properties of the coating. In the case of solvents, different solvents may be used depending on whether the coating is to be sprayed, brushed, etc., e.g. if a higher solids coating is desired for brush application it may be advantageous to use a low vapor pressure solvent such as a di-methyl ester mixture, e.g. a mixture of dimethyl succinate, dimethyl glutarate and dimethyl adipate to extend the pot life of the composition. A particularly preferred dimethyl ester mixture comprises about 25% dimethyl succinate, about 55% dimethyl glutarate, and about 20% dimethyl adipate. The amount of solvent present in the composition will depend on the particular solvent used, and the desired viscosity of the coating. If a low v.o.c. (volatile organic compound) coating is desired, it is generally necessary to brush-apply the coating, so that a lower level of solvent may be used, e.g. the ratio of solids to solvent may be from about 50:50 to 40:60.

In a preferred embodiment of the invention the polyurethane resin is present in an amount of from about 10 to 50 weight percent of the composition, and the first and second polymers are present in a weight ratio of from about 1:2 to 1:6; the stabilized conductive filler is present in an amount of from about 30 to 80 weight percent of the composition; and the azole is present in an amount of from about 0.1 to 3 weight percent of the composition, based on the total solids in the coating composition. Particularly preferred levels are from 10 to 25 weight percent of the polyurethane, from 40 to 70 weight percent of the filler, and from 0.5 to 1.75 percent of the triazole. A weight ratio of 1:3.2 of the first to second polymer is particularly preferred. Unless otherwise specified, all weight percents given herein are based on the total weight of solids in the coating composition.

The present invention is further directed to a method of inhibiting corrosion of substrates while maintaining EMI/RFI shielding comprising the steps of a) providing a corrosion inhibiting conductive coating according to the invention and b) applying the corrosion inhibiting coating to a substrate. This method may further comprise the step of c) curing the coating. The coating may be cured as described hereinabove, either at room temperature or by heating the substrate. It is preferred that prior to heat curing the coating be allowed to dry for approximately 30 minutes at ambient temperature. The coating may be applied to the substrate by doctor blade, brushing, spraying, and other conventional coating techniques. Spraying is generally preferred for convenience.

The coating of the invention may be used on any solid substrate, e.g. metals such as aluminum or steel, and composites such as metal filled, glass or carbon filled, or other polymer composites.

The invention further provides a substrate which is covered with a coating of the invention. The substrate may be bonded to a second substrate or a gasket, forming an assembled part, and exposed to severe environments such as salt fog with minimal corrosion of the part. For purposes of EMI/RFI shielding, the substrates and gasket generally are electrically conductive.

The following examples are illustrative of preferred embodiments of the invention and not of limiting effect. Other variations and modifications of the invention may be practiced by those skilled in the art without departing from the spirit and scope of the invention.

EXAMPLE 1

A corrosion inhibiting conductive coating of the invention was prepared using the formulation shown in Table 1. Part A was prepared by first mixing the xylene and the propylene glycol monomethyl ether acetate solvents, then dissolving the tolytriazole in this solvent mixture, which mixture serves both as a solvent for the triazole powder and a diluent to reduce the viscosity of the coating. Then the stabilized copper powder (Fujikura ® CP-10) was added to the triazole solution and mixed well. A conventional fluorocarbon surfactant (FC-430, commercially available from Minnesota Mining and Manufacturing) was then added and mixed. Then a 50% solution of a fluoroolefin vinyl ether polymer in xylene (LUMIFLON ®601) was added, and the batch was again mixed.

2.8 parts of part B, which comprised a methylene diisocyanate terminated castor oil prepolymer (URIC 2023) were then added to 97.2 parts of part A and mixed well. The resulting coating was spray coated on aluminum AL 35, (3000 alloy series), dried 15 minutes at ambient temperature, then cured for 30 minutes at 250° F., and tested, with results as shown in Table 2. The viscosity of the mixed coating composition doubled in approximately 45 minutes, which was considered to be the pot life of the mixture. The coated substrate was tack free, according to ASTM-D-1650, after 15 minutes at ambient temperature.

The data of Table 2 shows that the coating has excellent initial properties, and retains these properties for up to 1000 hours of salt fog exposure. Particularly importantly, a conductive interface having over 80 dB of EMI attenuation is maintained during the 1000 hour salt fog test. Additionally, no corrosion of the substrate was observed after the 1000 hour salt fog test.

TABLE 2

| Adhesion (ASTM-D-3359) | | Attenuation (Modified Mil Std 285) | |
| --- | --- | --- | --- |
| Initial | 5B (pass) | Initial | |
| 1000 hr salt fog** | 5B (pass) | @ 1 GHz | −95 dB |

TABLE 2-continued

|  |  |
|---|---|
| @ 300 MHz | −83 dB |
| 900 hr salt fog** |  |
| @ 1 GHz | −95 dB |
| @ 300 MHz | −83 dB |

| Gardner Impact |  | Surface Conductivity* (ohms/square) |  |
|---|---|---|---|
| Initial |  |  |  |
| Direct | 40 in-lbs | Initial | 0.04 |
| Reverse | 30 in-lbs | 120 hr salt fog** | 0.06 |
| 800 hr salt fog** |  | 290 hr salt fog** | 0.12 |
| Direct | 40 in-lbs | 500 hr salt fog** | 0.12 |
| Reverse | 30 in-lbs | 700 hr salt fog** | 0.16 |
|  |  | 1000 hr salt fog** | 0.37 |

*Per Quality Control Test Procedure #95-40-5104 available upon request from Chomerics, Inc.
**Salt Fog Test ASTM-B-117

TABLE 1

| Component | Parts by Weight |
|---|---|
| Part A |  |
| Xylene | 40.39 |
| Propylene glycol monomethyl ether acetate | 10.23 |
| Tolytriazole | 0.54 |
| Stabilized copper powder | 27.20 |
| Fluorocarbon surfactant | 0.06 |
| Fluoroolefin vinyl ether* | 18.76 |
| Part B |  |
| Methylene diisocyanate terminated castor oil prepolymer | 2.81 |

*50% solution in xylene

EXAMPLE 2

A corrosion inhibiting coating according to another embodiment of the invention was prepared according to Example 1, except that the tolytriazole was replaced with the same amount of a proprietary triazole available from PMC Specialties Group under the tradename CO-BRATEC® 205. The coating was tested as described in Example 1, with results as shown in Table 3.

The data of Table 3 shows that this coating also has excellent initial properties, and retains these properties during prolonged exposure to salt fog.

TABLE 3

| Gardner Impact |  | Surface Conductivity* (ohms/square) |  |
|---|---|---|---|
| Initial |  | Initial | 0.054 |
| Direct | 80 in-lbs | 168 hr salt fog** | 0.081 |
| Reverse | 80 in-lbs | 366 hr salt fog** | 0.12 |
|  |  | 504 hr salt fog** | 0.12 |
| Adhesion (ASTM-D-3359) |  |  |  |
| Initial | 5B (pass) |  |  |

*Per Quality Control Test Procedure #95-40-5104 available upon request from Chomerics, Inc.
**Salt Fog Test ASTM-B-117

EXAMPLE 3

A corrosion inhibiting coating was prepared according to Example 2, with the further addition of 5 weight percent zinc chromate, based on the total solids of the coating.

This coating (Sample 1) was then applied to AL 2024-class III (aluminum 2000 series) and tested using the procedures described in Example 1, with each test being conducted on two specimens. One specimen was tested as coated, while the coating on the other specimen was scratched before initial testing and subsequent exposure to salt fog. The coating of Example 2 (Sample 2) was then tested both as coated and scratched, using identical procedures. The results of this testing are shown in Table 4.

TABLE 4

|  | As Coated | Scratched |
|---|---|---|
| Surface Conductivity* (ohms/square) |  |  |
| Sample 1 |  |  |
| Initial | 0.021 | 0.021 |
| 120 hr salt fog** | 0.042 | 0.039 |
| 288 hr salt fog** | 0.048 | 0.056 |
| Sample 2 |  |  |
| Initial | 0.054 | 0.052 |
| 168 hr salt fog** | 0.081 | 1.42 |
| 336 hr salt fog** | 0.120 | 20.00 |
| Appearance |  |  |
| Sample 1 |  |  |
| Initial | pass | pass |
| 120 hr salt fog** | pass | pass |
| 288 hr salt fog** | pass | slightly black at scratches |
| Sample 2 |  |  |
| Initial | pass | pass |
| 168 hr salt fog** | pass | black with salt deposits |
| 336 hr salt fog** | pass | black and blistered |

*Per Quality Control Test Procedure #95-40-5104 available upon request from Chomerics, Inc.
**Salt Fog Test ASTM-B-117

Although the two formulations were not tested after the same number of hours exposure to salt fog, the data of Table 4 does demonstrate that after about 300 hours salt fog and scratched panels coated with the coating which contained zinc chromate retained much better surface conductivity and appearance than those coated with the coating of Example 2.

While the present invention has been described with reference to its preferred embodiments, other embodiments, variations and modifications can achieve the same result. Variations, modifications and equivalents of the present invention will be obvious to those skilled in the art and it is intended to cover in the appended claims all such modifications and equivalents as fall within the true spirit and scope of this invention.

What is claimed is:

1. A non-foamed corrosion inhibiting conductive coating comprising:
   a) a fluorinated polyurethane resin comprising:
      i) a first polymer selected from the group consisting of isocyanates and isocyanate terminated prepolymers; and
      ii) a fluorinated second polymer selected from the group consisting of polymers having an amine functionality, polymers having a hydroxyl functionality, polymers having both amine and hydroxyl functionalities, and mixtures thereof;
   b) a stabilized conductive filler; and
   c) an azole.

2. The coating of claim 1 wherein the first polymer is an isocyanate.

3. The coating of claim 2 wherein the isocyanate is methylene diisocyanate.

4. The coating of claim 1 wherein the first polymer is a methylene diisocyanate terminated castor oil prepolymer.

5. The coating of claim 1 wherein the second polymer is selected from the group consisting of polyether polyols and polyether amines.

6. The coating of claim 1 wherein the second polymer is a fluoroolefin vinyl ether copolymer.

7. The coating of claim 1 wherein the stabilized conductive filler is selected from the group consisting of stabilized copper powder, nickel powder, silver plated metals, nickel-graphite fibers and mixtures thereof.

8. The coating of claim 8 wherein the stabilized copper powder is produced by a process which comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid.

9. The coating of claim 1 wherein the stabilized conductive filler is produced by coating an unstabilized conductive filler with a fatty acid.

10. The coating of claim 1 wherein the stabilized conductive filler is produced by coating an unstabilized conductive filler with a noble metal.

11. The coating of claim 1 wherein the azole is selected from the group consisting of aromatic triazoles, imidazoles, and thiazoles.

12. The coating of claim 11 wherein the aromatic triazole is selected from the group consisting of tolytriazole and benzotriazole.

13. The coating of claim 1 further comprising a chromate salt.

14. The coating of claim 13 wherein the chromate salt is zinc chromate.

15. A non-foamed corrosion inhibiting conductive coating comprising:
   a) from about 10 to 50 weight percent of a fluorinated polyurethane resin comprising:
      i) a first polymer selected from the group consisting of isocyanates and isocyanate terminated prepolymers; and
      ii) a fluorinated second polymer selected from the group consisting of amines, polythiols and polyether polyols;
   b) from about 30 to 80 weight percent of a stabilized conductive filler; and
   c) from about 0.1 to 3 weight percent of an azole selected from the group consisting of aromatic triazoles, imidazoles or thiazoles.

16. The coating of claim 15 wherein the polyurethane resin is from about 10 to 25 weight percent of the coating.

17. The coating of claim 15 wherein the first and second polymers are present in a weight ratio of from about 1:2 to 1:6.

18. The coating of claim 15 wherein the stabilized conductive filler is from about 40 to 70 weight percent of the coating.

19. The coating of claim 15 wherein the aromatic triazole is from about 0.5 to 1.75 weight percent of the coating.

20. The coating of claim 15 wherein the first polymer is an isocyanate.

21. The coating of claim 20 wherein the isocyanate is methylene diisocyanate.

22. The coating of claim 15 wherein the first polymer is a methylene diisocyanate terminated castor oil prepolymer.

23. The coating of claim 15 wherein the second polymer is a fluoroolefin vinyl ether copolymer.

24. The coating of claim 15 wherein the stabilized conductive filler is selected from the group consisting of stabilized copper powder, nickel powder, silver plated metals, nickel-graphite fibers and mixtures thereof.

25. The coating of claim 24 wherein the stabilized copper powder is produced by a process which comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid.

26. The coating of claim 15 wherein the stablized conductive filler is produced by coating an unstabilized conductive filler with a fatty acid.

27. The coating of claim 15 wherein the stabilized conductive filler is produced by coating an unstabilized conductive filler with a noble metal.

28. The coating of claim 15 wherein the aromatic triazole is tolytriazole.

29. The coating of claim 15 wherein the aromatic triazole is benzotriazole.

30. A corrosion resistant substrate comprising a conductive substrate and a non-foamed corrosion inhibiting coating on the surface of said conductive substrate comprising:
   a) a fluorinated polyurethane resin comprising:
      i) a first polymer selected from the group consisting of isocyanates and isocyanate terminated prepolymers; and
      ii) a fluorinated second polymer selected from the group consisting of polymers having an amine functionality, polymers having a hydroxyl functionality, polymers having both amine and hydroxyl functionalities, and mixtures thereof;
   b) a stabilized conductive filler; and
   c) an azole.

31. The corrosion resistant substrate of claim 30 wherein the conductive substrate is aluminum.

32. The corrosion resistant substrate of claim 30 wherein the conductive substrate is a metal filled composite.

33. The corrosion resistant substrate of claim 30 wherein the azole is selected from the group consisting of aromatic triazoles, imidazoles, and thiazoles.

34. The corrosion inhibiting conductive coating of claim 1 wherein the second polymer is polytetramethyleneoxide-di-p-aminobenzoate.

35. The corrosion inhibiting conductive coating of claim 1 wherein the second polymer has a hydroxyl or amine functionality of greater than 1.

* * * * *